United States Patent [19]

Ikeno et al.

[11] 4,211,947
[45] Jul. 8, 1980

[54] THICKNESS-SHEAR MODE QUARTZ OSCILLATOR WITH AN ADDED NON-CIRCULAR MASS

[75] Inventors: Hitoshi Ikeno; Tetsuro Konno; Mitsuyuki Sugita; Hirobumi Yanagi, all of Tokyo, Japan

[73] Assignee: Kabushiki Kaisha Seikosha, Japan

[21] Appl. No.: 876,155

[22] Filed: Feb. 8, 1978

[30] Foreign Application Priority Data

Feb. 9, 1977 [JP] Japan .................................. 52-13344

[51] Int. Cl.$^2$ ............................................ H01L 41/10
[52] U.S. Cl. ..................................... 310/312; 310/365; 310/360
[58] Field of Search ............... 310/365, 320, 366, 312, 310/360

[56] References Cited

U.S. PATENT DOCUMENTS

| | | | |
|---|---|---|---|
| 2,159,891 | 5/1939 | Guerbilsky | 310/312 |
| 3,382,381 | 5/1968 | Horton | 310/365 X |
| 3,781,577 | 12/1973 | Nonaka | 310/312 X |
| 4,035,674 | 7/1977 | Oguchi et al. | 310/312 X |

FOREIGN PATENT DOCUMENTS

| | | | |
|---|---|---|---|
| 4638947 | 2/1962 | Japan | 310/365 |
| 4520226 | 2/1967 | Japan | 310/365 |

*Primary Examiner*—Mark O. Budd
*Attorney, Agent, or Firm*—Robert E. Burns; Emmanuel J. Lobato; Bruce L. Adams

[57] ABSTRACT

A thickness-shear mode quartz oscillator characterized in that an addition mass fitted to a driving electrode of the oscillator for the purpose of adjusting its oscillation frequency has a non-circular shape or the fitting position thereof is deviated from the center of a quartz slice, or both in combination. Such addition mass provides different piezoelectric effects and effects of addition of the mass between the fundamental main vibration and harmonic vibrations and eliminates or restricts a "frequency abnormal phenomenon". Consequently, even when driven by a C-MOS type integrated circuit not having a frequency selection circuit in its oscillation loop, the thickness-shear mode quartz oscillator exhibits stable frequency-temperature characteristics.

21 Claims, 18 Drawing Figures

THICKNESS-SHEAR MODE QUARTZ OSCILLATOR WITH AN ADDED NON-CIRCULAR MASS

BACKGROUND OF THE INVENTION

This invention relates to a thickness-shear mode quartz oscillator such as an AT-cut or a BT-cut.

It has experimentally been confirmed by the inventors of this invention that in thickness-shear mode quartz oscillators, there is a "frequency abnormal phenomenon" which is a different phenomenon from the well-known jump phenomenon (the phenomenon in which the main vibration of the thickness-shear made quartz oscillator is drawn into sub-vibrations such that its actual mode of vibration is different from the intended mode of the main vibration). If this "frequency abnormal phenomenon" is present within the practical application range of temperature and frequency of the use of the quartz oscillator, there take place various problems such as insufficient performance and unstable operation of the quartz oscillator and so forth.

FIGS. 1 and 2 illustrate an example of a heretofore known planoconvex type AT-cut quartz oscillator (frequency $f_0=4.2$ MHz). Driving electrodes 2, 2 having a diameter of 5.20 mm are formed on both surfaces of a quartz slice 1 having a diameter of 8.00 mm and a center thickness of 0.41 mm by evaporation or other suitable method. Take-out electrodes 2a, 2a are formed to extend from the driving electrodes 2, 2 in the radial direction and are connected to supporting springs (not shown). An addition mass 3 is formed on one of the driving electrodes 2 by evaporation or other suitable method in order to adjust the oscillation frequency $f_0$. The addition mass 3 has a real circle form and its center is in conformity with that of the driving electrode 2. The addition mass is generally made of the same material as that of the driving electrode (e.g. Au, Ag, etc.). At times, addition masses 3 are fitted to both driving electrodes 2, 2. The evaporation quantity of this addition mass 3 is referred to as a "plate-back quantity" and expressed in terms of a frequency drop (KHz) caused by the addition of the same.

A number of the quartz oscillators having the above-described construction were individually driven, as a sample 4, by a driving circuit consisting of a C-MOS type integrated circuit 5 not having a frequency selection circuit in its oscillation loop, and load capacitances $C_1$, $C_2$ and $C_3$ as shown in FIG. 3 to measure its frequency-temperature characteristics. Results of the measurement are shown in FIG. 4. The portions encompassed by a circle represent the positions at which the abovementioned "frequency abnormal phenomenon" occurs.

It has been found that this "frequency abnormal phenomenon" arises from the mutual interference between a fundamental wave current fed back by the fundamental main vibration and a harmonic wave current fed back by the harmonic vibrations, and is different from the conventional jump phenomenon. It has also been clarified that this phenomenon occurs with a higher probability especially in the sample having formed the addition mass 3 on the driving electrode 2 for the fine adjustment of the frequency as shown in FIGS. 1 and 2, and this tendency occurs more remarkably in convex lens type AT-cut quartz oscillators such as a planoconvex type of FIG. 5-B, a biconvex type of FIG. 5-C and bevelling types of FIGS. 5-C and 5-D than a flat plate type of FIG. 5-A. (It has been confirmed that the "frequency abnormal phenomenon" takes place also in a sample not having the addition mass film 3).

FIG. 6 illustrates the frequency-phase characteristics (resonance characteristics) of a sample of the conventional planoconvex type AT-cut quartz oscillator (plate-back quantity of the addition mass $3=4$ KHz) where $f_0$ is a fundamental frequency and $f_{31}$ and $f_{32}$ are a group of harmonics that are adjacently present near the triple frequency of the fundamental frequency $f_0$. As shown in the load capacitance characteristic curve of FIG. 7, the fundamental frequency $f_0$ varies in accordance with the load capacitance $C_L$. (The frequency adjustment of the quartz oscillator uses this phenomenon). However, $f_{31}/3$ and $f_{32}/3$ hardly cause any change. In the practical application, the load capacitance $C_L$ is mostly set to 10 PF or below because a smaller load capacitance generally provides a wider range for the frequency adjustment. Accordingly, in the practical application range of the load capacitance $C_L$, it sometimes occurs that $f_0$ coincides with $f_{32}/3$. Even when they do not, they become coincident with each other depending upon certain temperature conditions employed, because they are extremely approximate to each other. In this instance, $f_{32}/3$ exerts an influence on $f_0$ and thus causes the "frequency abnormal phenomenon". This generally applies to a group of harmonics of a multiple of an odd number of the fundamental frequency $f_0$.

In other words, in the AT-cut quartz oscillator, there are always present a series of groups of harmonics in the range of frequency n-folds (n=odd number) in which the fundamental frequency $f_0$ and a harmonic frequency $f_{ns}$ satisfying the following equation (1) is present with high probability in accordance with the production condition of the quartz oscillator, the driving circuit used and other factors;

$$f_0=f_{ns}/n \tag{1}$$

For the abovementioned reason, the "frequency abnormal phenomenon" shown in FIG. 4 occurs with high probability. The magnitude H of the "frequency abnormal phenomenon" (see FIG. 4) becomes greater when the degree n of the harmonic wave $f_{ns}$ is smaller.

The reason why this "frequency abnormal phenomenon" has not so far been a serious problem is that the occurrence of the phenomenon depends to a large extent upon the kind and performance of the driving circuit used to drive the quartz oscillator. This "frequency abnormal phenomenon" does not occur, for example, when the AT-cut quartz oscillator is driven by an oscillator circuit having a frequency selection/tuning circuit such as a tank circuit. Also, even when a C-MOS type integrated circuit 5 not having a frequency selection circuit in its oscillation loop (as shown in FIG. 3) is used, the "frequency abnormal phenomenon" does not occur, or is small even when its does occur, if the high frequency response characteristics of the integrated circuit 5 are not very good. As the high frequency response characteristics of the integrated circuit 5 become better, however, the "frequency abnormal phenomenon" occurs more remarkably with higher probability. Hence, the "frequency abnormal phenomenon" will become a serious problem in the near future as the development of the integrated circuit further proceeds and its high frequency response characteristics become more enhanced.

SUMMARY OF THE INVENTION

It is an object of the present invention to prevent occurrence of the "frequency abnormal phenomenon" even when a thickness-shear mode quartz oscillator is driven, for example, by a C-MOS type integrated circuit not having a frequency selection circuit in its oscillation loop.

It is another object of the present invention to remove the abovementioned "frequency abnormal phenomenon" in an extremely easy manner, that is, simply by changing the shape and position of an evaporation mask during formation of the addition mass.

It is still another object of the present invention to provide a thickness-shear mode quartz oscillator having stable operation and high performance.

One of the characteristic features of the present invention is that an addition mass has a non-circular shape.

Another feature of the present invention is that the addition mass is formed at a position deviated from the center of a quartz slice.

Still another feature of the present invention is that the addition mass has a non-circular shape and at the same time, it is formed at a position deviated from the center of the quartz slice.

BRIEF DESCRIPTION OF THE DRAWING

The nature, objects and advantages of the invention will be more fully understood from the following description in accordance with the accompanying drawings in which.

DETAILED DESCRIPTION OF THE INVENTION

Figure 3:
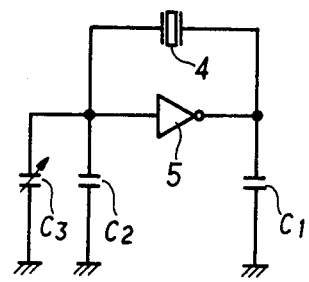
FIG. 3 is a driving circuit diagram of the abovementioned oscillator.
Figure 4:
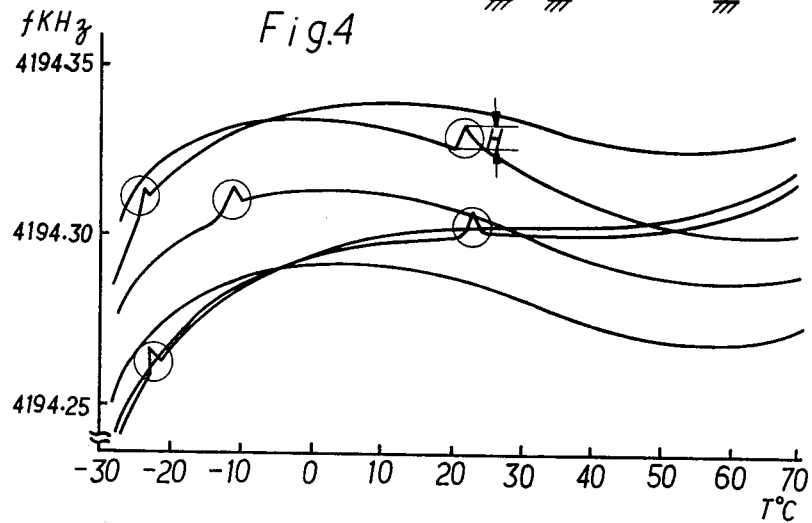
FIG. 4 is a frequency-temperature characteristic diagram of the conventional AT-cut quartz oscillator.
Figure 5:
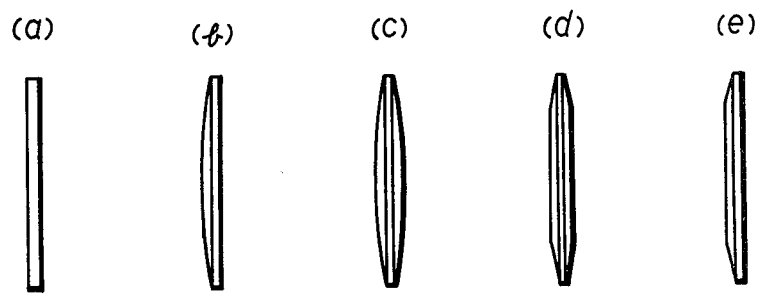
FIG. 5 are side views of various types of quartz oscillators.
Figure 6:
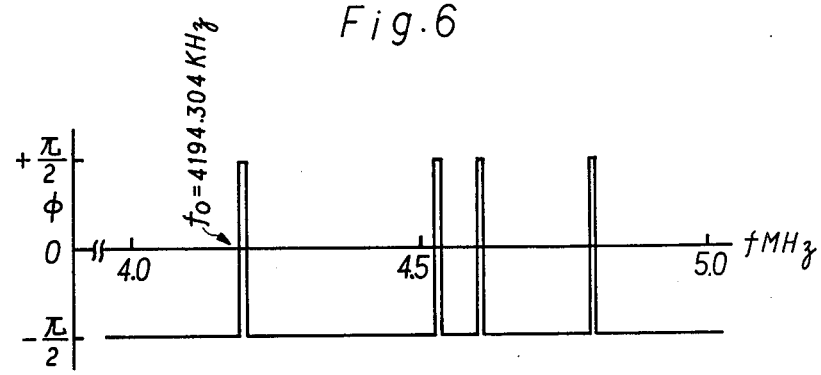
FIG. 6 is a frequency-phase characteristic diagram of the conventional AT-cut quartz oscillator.
Figure 6:
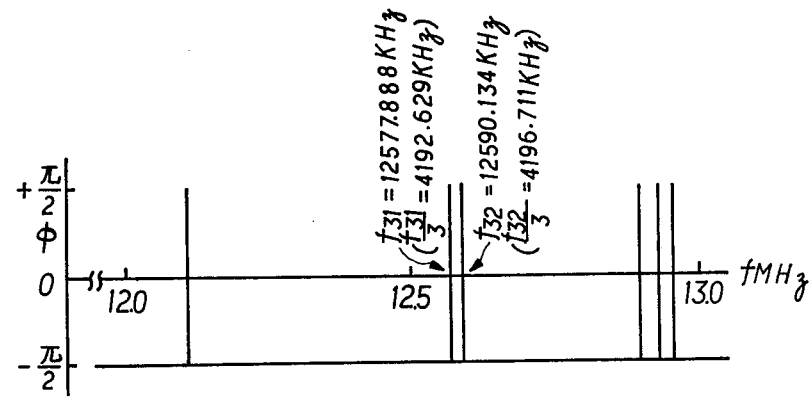
Figure 7:
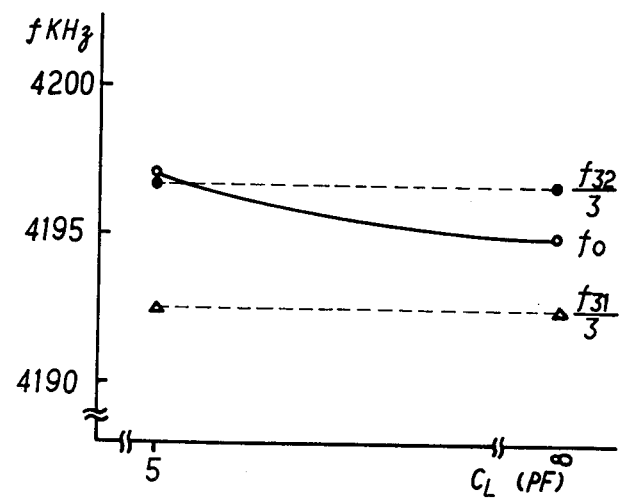
FIG. 7 is a load capacitance characteristic diagram of the conventional AT-cut quartz oscillator.
Figure 8:
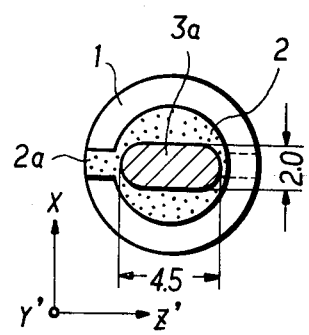
FIGS. 8 and 9 are respectively a front view and a longitudinal sectional view at the center of an AT-cut quartz oscillator of an embodiment in accordance with the present invention.
Figure 9:
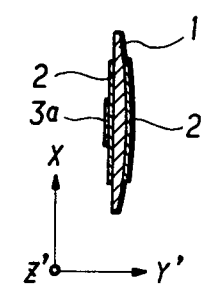
Figure 10:
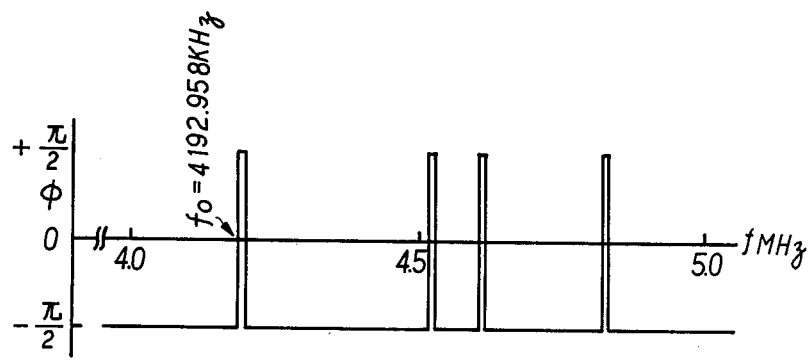
FIG. 10 is a frequency-phase characteristic diagram of the AT-cut quartz oscillator in accordance with the present invention.
Figure 10:
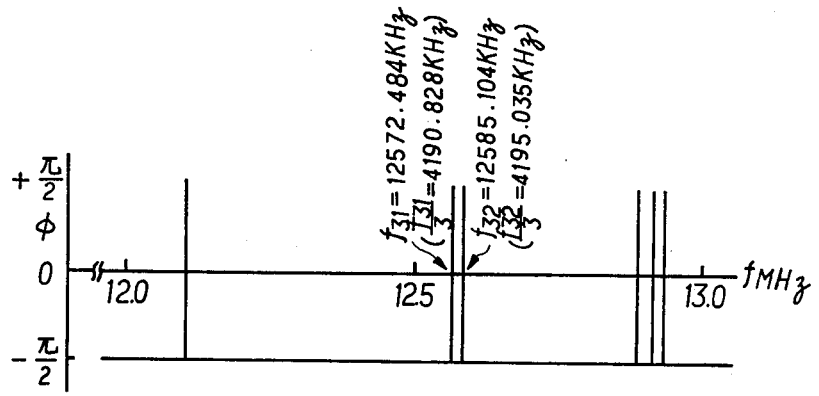
Figure 11:
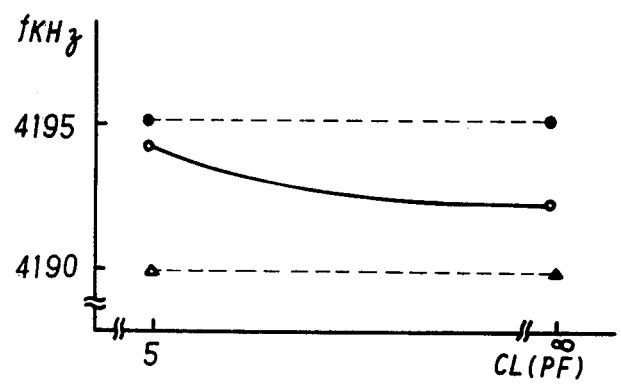
FIG. 11 is a load capacitance characteristic diagram of the AT-cut quartz oscillator in accordance with the present invention.
Figure 12:
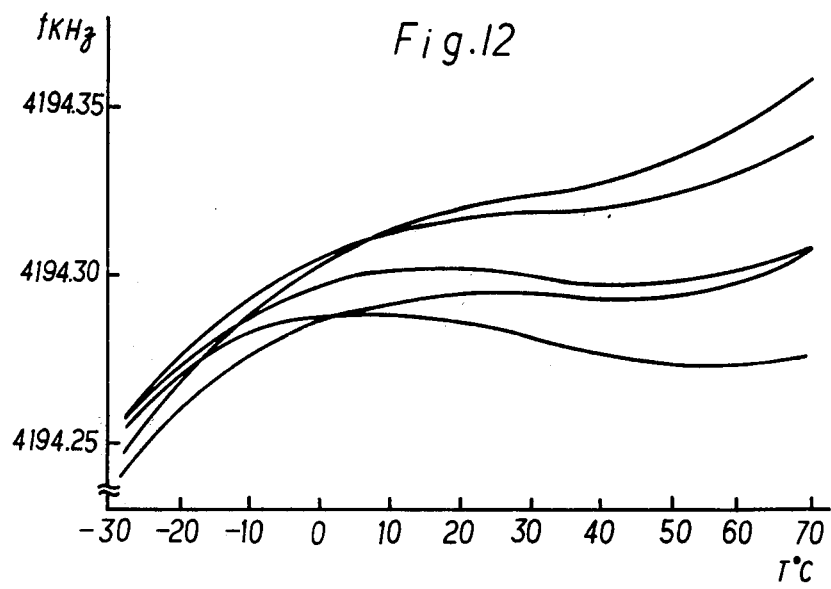
FIG. 12 is a frequency-temperature characteristic diagram of the AT-cut quartz oscillator in accordance with the present invention.

Explanation will be first given on the embodiment in which the addition mass has a non-circular shape. As shown in FIGS. 8 and 9, the addition mass $3a$ in one embodiment of the present invention is characterized in that it has a non-circular shape, that is to say, it is thinly elongated in the direction of $Z'$ axis. In this embodiment, the quartz slice 1, the driving electrodes 2, 2 and the take-out electrodes $2a$, $2a$ have the same shape and size as those in the conventional device. FIG. 10 illustrates frequency-phase characteristics of a quartz oscillator sample whose addition mass 3 has a plate-back quantity of 4 KHz, and FIG. 11 illustrates its load capacitance characteristics. As can be clearly seen from FIG. 11, the fundamental frequency $f_0$ is sufficiently separated from $f_{31}/3$ and $f_{32}/3$ which are one-third frequencies of a group of harmonics near the triple frequency of the fundamental frequency $f_0$. Hence, they do not mutually cross even when the load capacitance $C_L$ is varied as was the case with the prior art quartz oscillators—compare FIGS. 7 and 11, for example. As previously described, this results from the fact that the piezoelectric effect and the effect of addition of the addition mass 3 are different between the fundamental vibration and the harmonic sub-vibrations so that the rate of change in the respective frequencies becomes different. It has been found that this also applies as such to other quartz oscillator samples. Using the same driving circuit as the conventional circuit shown in FIG. 3, the frequency-temperature characteristics of the oscillator were measured in the range of temperature of from $-30°$ C. to $+70°$ C. As shown in FIG. 12, the characteristic curve continuously changes and the "frequency abnormal phenomenon" is not absolutely observed.

This generally holds good also for the other types of non-circular addition masses $3b-3f$ shown in FIGS. 15(a)-(e). Various other shapes may also be employed.

Figure 13:
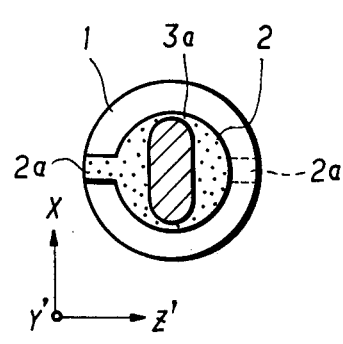
FIG. 13 is a front view of an AT-cut quartz oscillator in another embodiment in accordance with the present invention.
Figure 14:
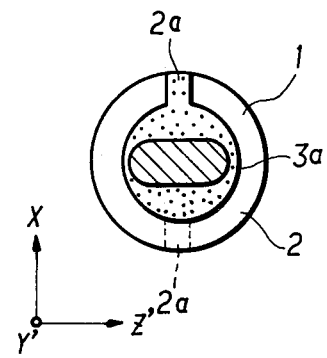
FIG. 14 is a front view of an AT-cut quartz oscillator in still another embodiment in accordance with the present invention.

Though the longitudinal direction of the addition mass 3 in this embodiment is substantially in conformity with the $Z'$ direction of the quartz slice 1, it may be substantially in conformity with the X direction as shown in FIG. 13. In this manner, the gap between the addition mass $3a$ and the take-out electrode $2a$ can be made sufficiently large, thereby eliminating a possible short-circuit with the supporting sping even if the position of the addition mass $3a$ is considerably deviated during evaporation. In comparison with the embodiment wherein the longitudinal direction of the addition mass $3a$ coincides with the direction of X axis of the quartz slice shown in FIG. 13, the embodiment wherein the longitudinal direction of the addition mass $3a$ coincides with the direction of $Z'$ axis shown in FIG. 8 provides a greater effect of preventing the "frequency abnormal phenomenon".

It is customary to arrange the take-out electrodes 2a, 2a of the driving electrodes 2 in the direction of Z' axis in view of the aging characteristics. In order to reliably eliminate the "frequency abnormal phenomenon" at the sacrifice of the aging characteristics to a certain extent, the take-out electrodes 2a, 2a are formed in the direction of X axis and the addition mass 3a is formed in the direction of Z' axis. In comparison with the case where the longitudinal direction of the addition mass 3 is in conformity with the X axis (shown in FIG. 13), the prevention effect of the "frequency abnormal phenomenon" is further reduced when the longitudinal direction of the addition mass 3a is positioned at an angle of 45° with respect to the Z' axis or the X axis.

Figure 1:
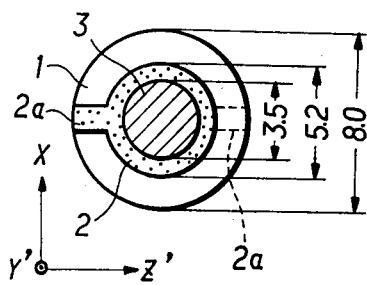
FIGS. 1 and 2 are respectively a front view and a longitudinal sectional view at the center of the conventional AT-cut quartz oscillator.
Figure 2:
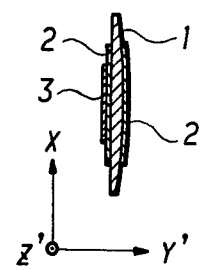
Figure 15:
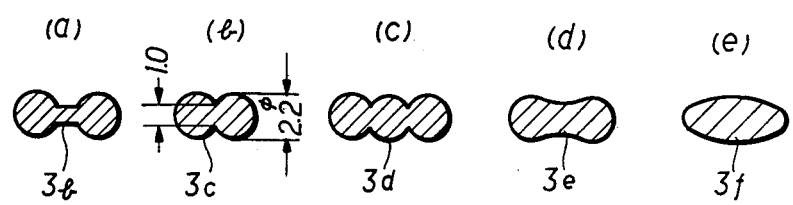
FIG. 15 is a schematic view showing the shape of an addition mass in accordance with the present invention.
Figure 16:
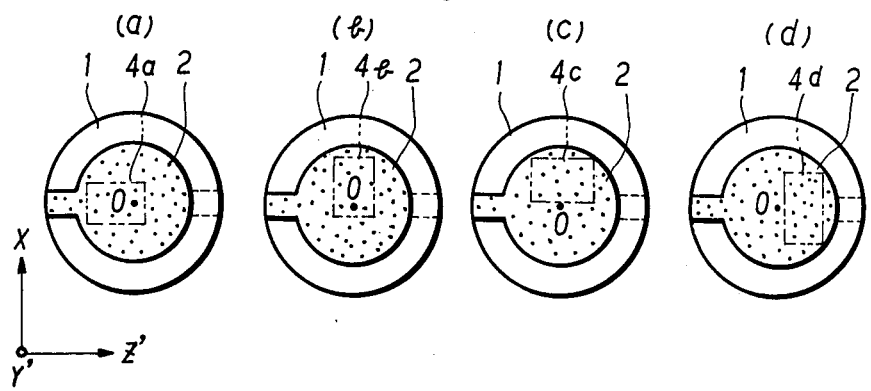
FIG. 16 is a schematic view showing the position of forming the addition mass in accordance with the present invention.

In the above-described embodiment, the addition mass 3a is formed at the central position of the quartz slice 1. However, the same effect can be obtained as in the abovementioned embodiment by forming the addition mass 3a at positions 4a–4d that are deviated from the center 0 of the quartz slice 1 as depicted to FIG. 16. In this case, the addition mass 3 may have a single circular shape as in the conventional addition mass 3 (shown in FIG. 1). It is also possible to properly combine addition masses 3a–3f of various non-circular shapes, such as shown in FIG. 15 with the abovementioned positions 4a–4d.

Figure 17:
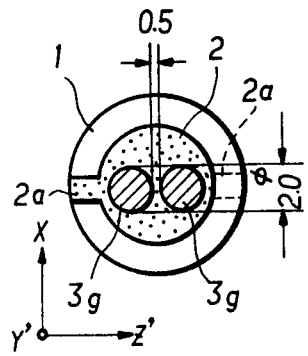
FIG. 17 is a front view of an AT-cut quartz oscillator in still another embodiment in accordance with the present invention.

Furthermore, the same effect as in the abovementioned embodiment can be obtained by disposing a plurality of perfectly separated addition masses 3g, 3g at positions deviated from the center 0 of the quartz slice 1 as shown in FIG. 17. In this case, the addition masses 3g, 3g may have any desired shape such as heretofore disclosed including a true circle.

Figure 18:
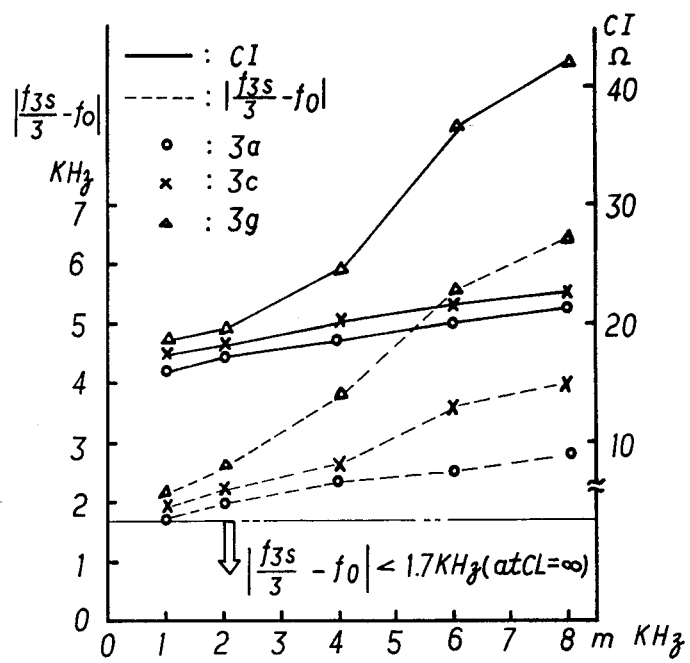
FIG. 18 is a diagram showing the relation between the plate-back quantity of the addition mass in the present invention and the crystal impedance CI and between the plate-back quantity of the addition mass and $|f_{3s}/3 - f_0|$.

Next, the addition mass 3a shown in FIG. 8, the addition mass 3c in FIG. 15(b) and the addition masses 3g, 3g in FIG. 17 were respectively fitted at the center 0 of the quartz slice 1 having the same shape and size as the quartz slice 1 of the abovementioned embodiment by respectively varying the plate-back quantity m to thereby form quartz oscillators having a 4.2 MHz band. Each of the oscillators thus produced was driven at a load capacitance $C_L = \infty$, and the crystal impedance CI and $|f_{3s}/3 - f_0|$ were measured. Results of the measurement are shown in FIG. 18.

It has been found from the experimental results that when the load capacitance $C_L$ is $\infty$ in the 4.2 MHz band, the occurrence of the "frequency abnormal phenomenon" can be reliably restrained even by setting the load capacitance $C_L$ in the practical application range (10 PF or below) if the following relation is satisfied;

$$|F_{3s}/3 - f_0| > 1.7 \text{ KHz} \quad (2)$$

Next, observation was made on each of the addition masses 3a, 3c and 3g. In the case of the addition mass 3a, the crystal impedance CI tends to become excessively large when the plate-back quantity m becomes greater, whereas the addition mass 3g tends to fail to satisfy the abovementioned relation (2) due to production error, etc., when the plate-back quantity m is small. Hence, the addition mass 3c is most preferable.

In the case of the planoconvex type, the addition masses 3a... are preferably formed on the plane surface rather than on the curvature because it has been experimentally confirmed that undulation tends to occur on the frequency-temperature characteristic curve when the addition masses 3a... are formed on the curvature.

Though the foregoing embodiment deals with the AT-cut, the explanation applies also to other thicknesssshear modes such as a BT-cut.

As described in detail in the foregoing paragraphs, the addition mass in accordance with the present invention has a non-circular shape or its center is deviated from the center of the quartz slice, or both are combined together, in order to sufficiently separate $f_{ns}/n_f$ from $f_O$ and thus to always satisfy the relation $f_0 \neq f_{ns}/n$ under varying conditions by utilizing the fact that the piezoelectric effect and the effect of addition of the addition mass over the fundamental main vibration are different from those over a group of n-fold harmonics having frequencies $f_{ns}$. In consequence, it is possible to reliably prevent the occurrence of the "frequency abnormal phenomenon" simultaneously with the fine adjustment of frequency as the original object. Accordingly, the operation of the quartz oscillator is stabilized and its characteristics becomes extremely excellent. The measure taken in the present invention for preventing the "frequency abnormal phenomenon" can be performed by only changing the shape or the position of the evaporation mask. Hence, it never requires any change in the conventional production process and is therefore extremely simple. Especially, the AT-cut quartz oscillator in accordance with the present invention exhibits an excellent effect when applied to a C-MOS type integrated circuit not having a frequency selection circuit in its oscillation loop and this effect will become more remarkable as the high frequency response characteristics of the integrated circuit is further improved.

What is claimed is:

1. A thickness-shear mode quartz oscillator comprising: a thickness-shear mode quartz slice, driving electrodes formed on both surfaces of said quartz slice and an addition mass formed on at least one of said driving electrodes, the improvement wherein said addition mass has a non-circular shape and is suitably positioned so that the frequency $f_O$ of the fundamental main vibration and the frequencies $f_{ns}$ of a group of n-fold harmonics (where n is an odd number of 3 or more) always satisfy the following relation within the practical application ranges of temperature and load capacitance;

$$f_O \neq f_{ns}/n.$$

2. The thickness-shear mode quartz oscillator as defined in claim 1 wherein said quartz slice has a convex lens-like shape having thickness at its center than at its peripheral portion.

3. The thickness-shear mode quartz oscillator as defined in claim 1 wherein said addition mass is transversely elongated and the longitudinal direction thereof is substantially in parallel with the direction of the Z' axis or the X axis of said quartz slice.

4. The thickness-shear mode quartz oscillator as defined in claim 1 wherein said addition mass is transversely elongated and the longitudinal direction thereof is substantially in parallel with the direction of the Z' axis or the X axis of said quartz slice, and wherein said driving electrodes each have a take-out electrode extending in the direction intersecting at right angles to the longitudinal direction of said addition mass.

5. The thickness-shear mode quartz oscillator as defined in claim 1 wherein said quartz slice has a planoconvex shape and said addition mass is formed on the plane surface of said quartz slice.

6. A thickness-shear mode quartz oscillator comprising: a thickness-shear mode quartz slice, driving electrodes formed on both surfaces of said quartz slice and an addition mass formed on at least one of said driving electrodes, the improvement wherein the center of said addition mass is deviated from the center of said quartz slice and positioned so that the frequency $f_O$ of the fundamental main vibration and the frequencies $f_{ns}$ of a group of n-fold harmonics (where n is an odd number of 3 or more) always satisfy the following relation within the practical application ranges of temperature and load capacitance;

$$f_O \ne f_{ns}/n.$$

7. The thickness-shear mode quartz oscillator as defined in claim 6 wherein said quartz slice has a convex lenslike shape having a larger thickness at its center than at its peripheral portion.

8. The thickness-shear mode quartz oscillator as defined in claim 6 wherein said addition mass is transversely elongated and the longitudinal direction thereof is substantially in parallel with the direction of the Z' axis or the X axis of said quartz slice.

9. The thickness-shear mode quartz oscillator as defined in claim 6 wherein said addition mass is transversely elongated and the longitudinal direction thereof is substantially in parallel with the direction of the Z' axis or the X axis of said quartz slice, and wherein said driving electrodes each have a take-out electrode extending in the direction intersecting at right angles to the longitudinal direction of said addition mass.

10. The thickness-shear mode quartz oscillator as defined in claim 6 wherein said quartz slice has a planoconvex shape and said addition mass is formed on the plane surface of said quartz slice.

11. A thickness-shear mode quartz oscillator comprising: a thickness-shear mode quartz slice, driving electrodes formed on both surfaces of said quartz slice and an addition mass formed on at least one of said driving electrodes, the improvement wherein said addition mass has a non-circular shape and is positioned with the center thereof deviated from the center of said quartz slice so that the frequency $f_O$ of the fundamental main vibration and the frequencies $f_{ns}$ of a group of n-fold harmonics (where n is an odd number of 3 or more) always satisfy the following relation within the practical application ranges of temperature and load capacitance;

$$f_O \ne f_{ns}/n.$$

12. The thickness-shear mode quartz oscillator as defined in claim 11 wherein said quartz slice has a convex lenslike shape having a larger thickness at its center than at its peripheral portion.

13. The thickness-shear mode quartz oscillator as defined in claim 11 wherein said addition mass is transversely elongated and the longitudinal direction thereof is substantially in parallel with the direction of the Z' axis or the X axis of said quartz slice.

14. The thickness-shear mode quartz oscillator as defined in claim 11 wherein said addition mass is transversely elongated and the longitudinal direction thereof is substantially in parallel with the direction of the Z' axis or the X axis of said quartz slice, and wherein said driving electrodes each have a take-out electrode extending in the direction intersecting at right angles to the longitudinal direction of said addition mass.

15. The thickness-shear mode quartz oscillator as defined in claim 11 wherein said quartz slice has a planoconvex shape and said addition mass is formed on the plane surface of said quartz slice.

16. A thickness-shear mode quartz oscillator as defined in claim 1 wherein said quartz slice has a generally circular shape.

17. A thickness-shear mode quartz oscillator as defined in claim 16 wherein said driving electrodes have a generally circular shape.

18. A thickness-shear mode quartz oscillator as defined in claim 6 wherein said quartz slice has a generally circular shape.

19. A thickness-shear mode quartz oscillator as defined in claim 18 wherein said driving electrodes have a generally circular shape.

20. A thickness-shear mode quartz oscillator as defined in claim 11 wherein said quartz slice has a generally circular shape.

21. A thickness-shear mode quartz oscillator as defined in claim 20 wherein said driving electrodes have a generally circular shape.

* * * * *